US012322446B2

(12) United States Patent
Saxena (10) Patent No.: US 12,322,446 B2
(45) Date of Patent: Jun. 3, 2025

(54) REDUCED WORD LINE VOLTAGE DURING DISCHARGE PHASE OF READ OPERATION (71) Applicant: Samsung Electronics Co., Ltd., Suwon-si (KR)

(72) Inventor: Himanshu Saxena, Karnataka (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 193 days.

(21) Appl. No.: 17/657,814

(22) Filed: Apr. 4, 2022

(65) Prior Publication Data

US 2023/0197162 A1 Jun. 22, 2023

(30) Foreign Application Priority Data

Dec. 16, 2021 (IN) .............................. 202141058811

(51) Int. Cl.
*G11C 17/16* (2006.01)
*G11C 16/08* (2006.01)
*G11C 16/10* (2006.01)
*G11C 16/24* (2006.01)
*G11C 16/28* (2006.01)
*G11C 16/30* (2006.01)
*G11C 16/32* (2006.01)
*G11C 17/12* (2006.01)
*G11C 17/18* (2006.01)

(52) U.S. Cl.
CPC ............ *G11C 16/102* (2013.01); *G11C 16/08* (2013.01); *G11C 16/24* (2013.01); *G11C 16/28* (2013.01); *G11C 16/30* (2013.01); *G11C 16/32* (2013.01); *G11C 17/12* (2013.01)

(58) Field of Classification Search
CPC ....... G11C 16/102; G11C 16/08; G11C 16/24; G11C 16/28; G11C 16/30; G11C 16/32; G11C 17/12
USPC .................................................. 365/189.011
See application file for complete search history.

(56) References Cited

U.S. PATENT DOCUMENTS

| 6,671,040 | B2 | 12/2003 | Fong et al. |
| 8,130,532 | B2 | 3/2012 | Kurjanowicz et al. |
| 8,279,704 | B2 | 10/2012 | Scheuerlein et al. |
| 8,397,130 | B2 * | 3/2013 | Clark ................... G06F 11/1407 714/763 |
| 10,192,629 | B2 | 1/2019 | Qiu et al. |
| 10,446,239 | B1 * | 10/2019 | Fifield ...................... G11C 7/18 |
| 11,024,393 | B1 * | 6/2021 | Zhang ................ G11C 16/0483 |
| 2008/0266973 | A1 | 10/2008 | Sekar et al. |
| 2009/0119447 | A1 | 5/2009 | Lee et al. |

(Continued)

FOREIGN PATENT DOCUMENTS

KR 101428767 B1 8/2014

*Primary Examiner* — Alexander Sofocleous
*Assistant Examiner* — James S Wells
(74) *Attorney, Agent, or Firm* — Myers Bigel, P.A.

(57) ABSTRACT

An OTP memory includes a plurality of bitcells, a plurality of bitlines, each bitline coupled to the plurality of bitcells, and a wordline generation circuit coupled to each of the plurality of bitcells. The wordline generation circuit is configured to control a wordline voltage of at least one selected bitcell of the plurality of bitcells to discharge current of at least one bitline coupled to the at least one selected bitcell during a pre-conditioning phase and to perform a read operation of the at least one selected bitcell following the pre-conditioning phase in a same clock cycle.

9 Claims, 11 Drawing Sheets (56) References Cited

U.S. PATENT DOCUMENTS

| | | | |
|---|---|---|---|
| 2013/0235663 A1* | 9/2013 | Walsh | G11C 16/28 |
| | | | 365/185.21 |
| 2017/0098472 A1* | 4/2017 | Perner | G11C 11/5642 |
| 2019/0103145 A1 | 4/2019 | Tseng et al. | |
| 2020/0350031 A1* | 11/2020 | Chung | G11C 17/165 |

* cited by examiner

REDUCED WORD LINE VOLTAGE DURING DISCHARGE PHASE OF READ OPERATION

CROSS-REFERENCE TO RELATED APPLICATION

This application claims priority from Indian Patent Application No. 202141058811 filed on Dec. 16, 2021 in the Korean Intellectual Property Office, and all the benefits accruing therefrom under 35 U.S.C. 119, the contents of which in its entirety are herein incorporated by reference.

TECHNICAL FIELD

The present disclosure relates to the field of semiconductor integrated circuits and more particularly to managing a read operation of a one-time programmable (OTP) memory.

BACKGROUND

Figure 1A:
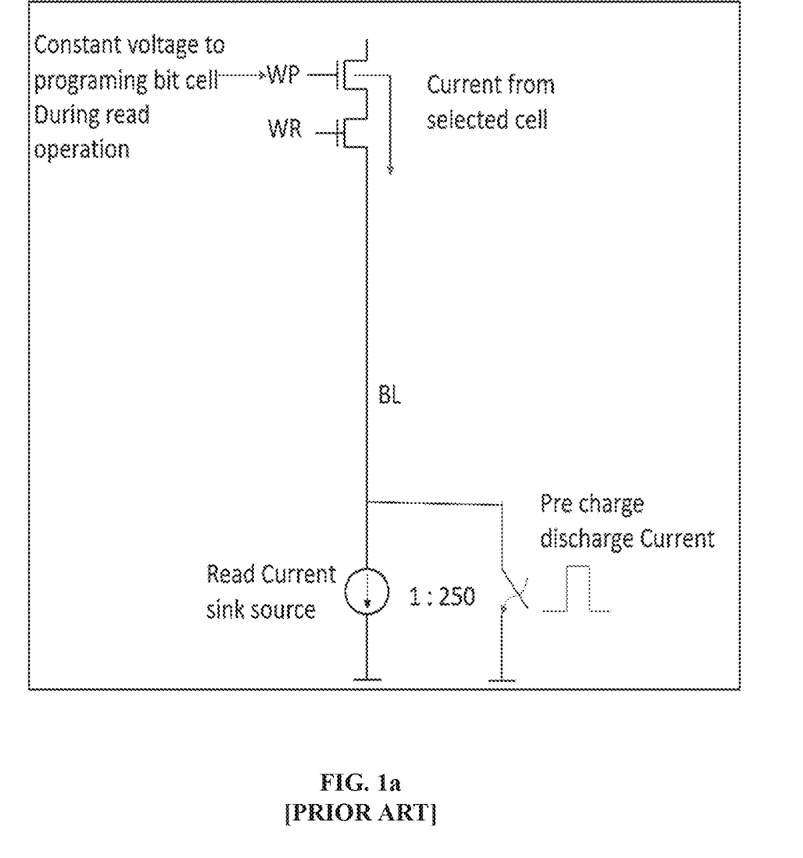
FIGS. 1a and 1b are example diagrams depicting a conventional approach of managing a read operation of a one time programmable (OTP) memory, wherein unintended pre-conditioning bitline discharge current occurs at a beginning of the read operation.

A one time programmable (OTP) memory is a special type of non-volatile memory (NVM) that permits data to be written to a memory only once. Once the memory has been written/programmed, the memory retains its data upon loss of power. The OTP memory includes a plurality of OTP memory cells/bitcells, wherein each bitcell is connected to one of the plurality of bitlines and one of the plurality of wordlines, as depicted in FIG. 1a. The wordline includes a wordline for program (WP) and a wordline for read gate (WR).

A program/write operation of the OTP memory includes writing the data to the selected bitcell by applying high regulated voltage of, for example, 2.5 times that of a read voltage to the WR of the selected bitcell.

Figure 1B:
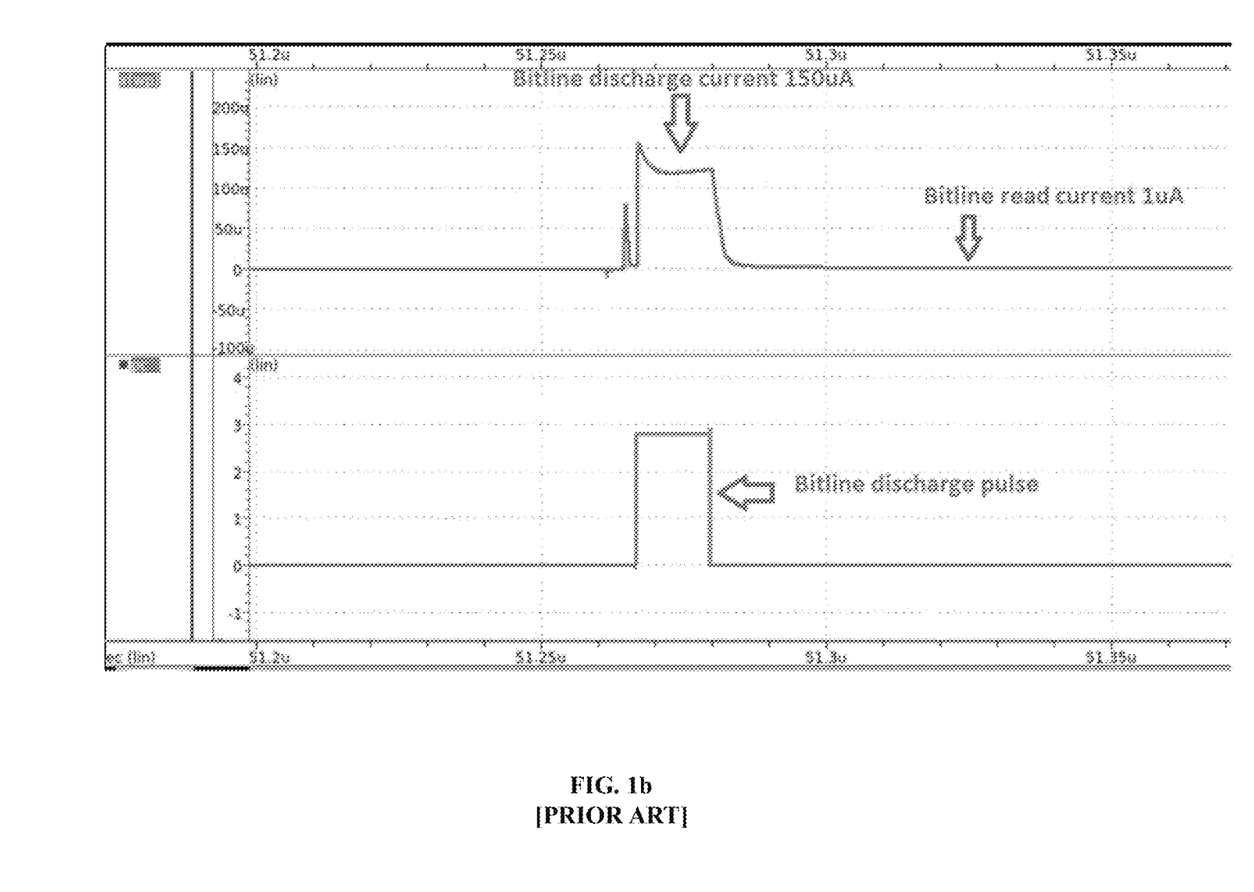

A read operation of the OTP memory includes discharging current of the bitline coupled to the selected bitcell during a pre-conditioning phase (i.e., at beginning of the read operation) and then reading the selected bitcell. As the bitlines have been pre-charged to a WR level at an end of each read/write cycle, the bitline coupled to the selected bitcell may be discharged to a ground or common voltage from the pre-charged voltage during the pre-conditioning phase. The bitline may be discharged to the ground voltage using a PC discharge pulse before enabling a sense amplifier. In some approaches, a constant regulated voltage may be applied to both the WP and the WR associated with the selected bitcell during the read operation. However, applying the constant regulated voltage to the WP and the WR may cause unintended pre-conditioning bitline discharge current at the beginning of the read operation (i.e., in the pre-conditioning phase), irrespective of read cycle time, as depicted in FIG. 1b. The unintended conditioning bitline discharge current may be very high compared to actual current of the bitline during the read operation of the bitcell. In an example, a ratio of the discharge current of the bitline during the pre-conditioning phase to the actual bit current of the bitline during the read operation may be 250:1. Such a high current ratio may cause a high overshoot of a regulated output voltage, which may take considerable time to settle to a nominal level.

In some approaches, a regulator may be used to support the unintended pre-conditioning bitline discharge current during the pre-conditioning phase. However, an area of the regulator may be too large to support the regulated voltage at high currents.

SUMMARY

Some embodiments of the inventive concept may provide methods and systems for managing a read operation of a one-time programmable (OTP) memory.

Other embodiments of the inventive concept may provide methods and systems for controlling the wordline voltage of at least one selected bitcell of an OTP memory to discharge current of at least one bit line coupled to the at least one selected bitcell during a pre-conditioning phase and to read the at least one selected bitcell following the pre-conditioning phase in a same clock cycle.

Accordingly, the embodiments herein provide a one time programmable (OTP) memory comprising a plurality of bitcells, a plurality of bitlines, each bitline coupled to the plurality of bitcells, and a wordline generation circuit coupled to each of the plurality of bitcells. The wordline generation circuit is configured to control a wordline voltage of at least one selected bitcell of the plurality of bitcells to discharge current of at least one bitline coupled to the at least one selected bitcell during a pre-conditioning phase and to perform a read operation of the at least one selected bitcell following the pre-conditioning phase in a same clock cycle.

Accordingly, the embodiments herein disclose a method for managing a read operation of a one time programmable (OTP) memory. The method disclosed herein includes controlling a wordline voltage of at least one selected bitcell of a plurality of bitcells of the OTP memory to discharge current of at least one bitline coupled to the at least one selected bitcell during a pre-conditioning phase and performing a read operation of the at least one selected bitcell following the pre-conditioning phase in a same clock cycle.

These and other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and the example embodiments herein include all such modifications.

BRIEF DESCRIPTION OF FIGURES

Embodiments herein are illustrated in the accompanying drawings, throughout which like reference letters indicate corresponding parts in the various figures. The embodiments herein will be better understood from the following description with reference to the drawings, in which.

DETAILED DESCRIPTION

The example embodiments herein and the various features and advantageous details thereof are explained more fully with reference to the non-limiting embodiments that are illustrated in the accompanying drawings and detailed in the following description. Descriptions of well-known components and processing techniques are omitted to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. Hereinafter, example embodiments of the present inventive concept will be described with reference to the accompanying drawings.

Embodiments herein disclose methods and systems for managing a read operation of a one time programmable (OTP) memory by controlling the wordline voltage of at least one selected bitcell of the OTP memory device to discharge current of at least one bitline coupled to the at least one selected bitcell during a pre-conditioning phase and to read the at least one selected bitcell following the pre-conditioning phase in a same clock cycle.

Referring now to the drawings, and more particularly to FIGS. 2 through 10, where similar reference characters denote corresponding features consistently throughout the figures, there are shown example embodiments.

Embodiments herein use the terms "OTP memory device," "OTP memory," "special type of non-volatile memory," and the like, interchangeably to refer to a memory that permits data to be written or programmed only once.

Embodiments herein use terms such as "OTP memory cells," "bitcells," and on the like, interchangeably to refer to a memory cell that stores the data.

Embodiments herein use terms such as "pre-conditioning phase," "discharging phase," and on the like, interchangeably to refer to a phase wherein current of a bitline coupled to a selected bitcell for read operation is discharged.

Figure 2:
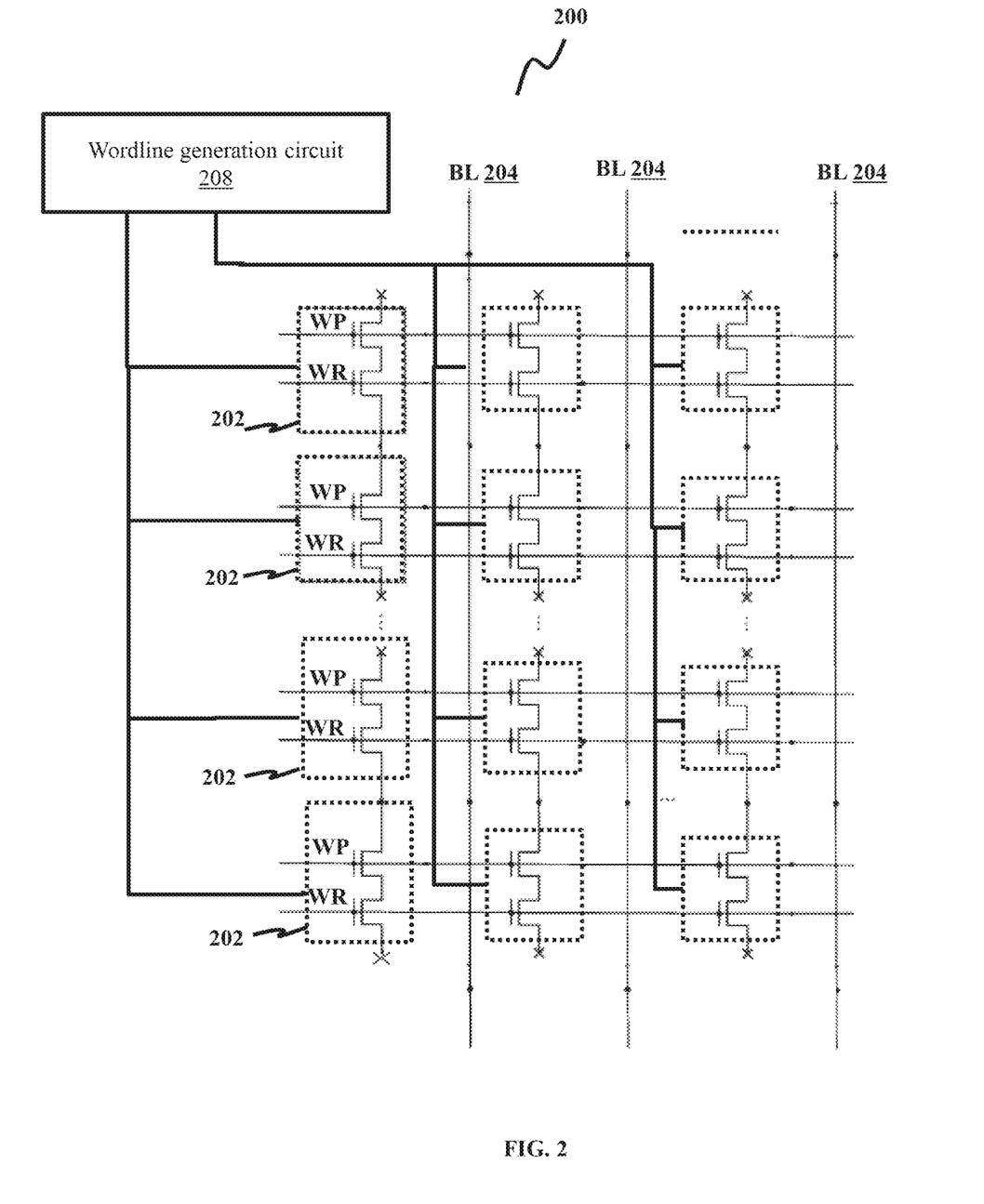
FIG. 2 depicts a one time programmable (OTP) memory, according to embodiments of the inventive concept as disclosed herein.

FIG. 2 depicts a one time programmable (OTP) memory 200, according to embodiments of the inventive concept as disclosed herein.

The OTP memory 200 referred to herein may be a memory that cannot change the stored data once the data is written or programmed in the memory. The OTP memory 200 may retain the data upon loss of power. In an example, the OTP memory 200 may be a volatile memory. In another example, the OTP memory 200 may be a non-volatile memory. Examples of the OTP memory 200 may be, but are not limited to, read only memory (ROM), a magnetic memory, optical memory, flash memory, or any other type of volatile or non-volatile memory.

In an example, the OTP memory 200 may be embodied as an independent device. In another example, the OTP memory 200 may be included in other devices such as, but not limited to, a semiconductor memory device, a system device (system-on-chip (SOC)), and on the like. The OTP memory 200 may be used to provide repair information for controlling usage of redundant cells to replace defective cells of the semiconductor memory device, enable or disable a part of the semiconductor memory device or the system device, trim capacitance values or resistance values of circuits, and various other functions.

The OTP memory 200 includes a plurality of OTP memory cells/bitcells 202, a plurality of bitlines 204, a plurality of wordlines, and a wordline generation circuit 208. The OTP memory 200 also includes a row selection circuit, a column selection circuit, and a read-write circuit among other circuitry. According to some example embodiments, the OTP memory 200 may also include a control logic that controls the operations of the OTP memory 200 including any or all of the operations described herein with respect to of the OTP memory 200 and a wordline generation circuit 208. The control logic included in the OTP memory 200 may be implemented as a circuit, as one or more programs (e.g., software/firmware), or a combination of circuitry and software. For example, the control logic of the OTP memory 200 may be a processor. According to at least some example embodiments, the operations of the OTP memory 200 may be controlled by an external device. The term 'processor,' as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multi-processor, an application-specific integrated circuit (ASIC), and/or a field programmable gate array (FPGA).

The plurality of OTP memory cells/bitcells 202 may be coupled to the plurality of bitlines (BL) 204, and the plurality of wordlines (WL), respectively. The wordlines may include voltage wordlines/wordlines for program (WP) 206a and read wordlines/wordline for read (WR) 206b.

The OTP memory cell/bitcell 202 may be configured to store the data. A read operation may be performed on the OTP memory cell/bitcell 202 to access the stored data. A write/program operation may be performed on the OTP memory cell/bitcell 202 to write/program the data into the OTP memory cell/bitcell 202. After the data is written/programmed into the OTP memory cell/bitcell 202, a structure of the OTP memory cell/bitcell 202 may be changed irreversibly, and the data '0' or '1' may be stored in the OTP memory cell/bitcell 202 using the irreversible structure.

Figure 3:
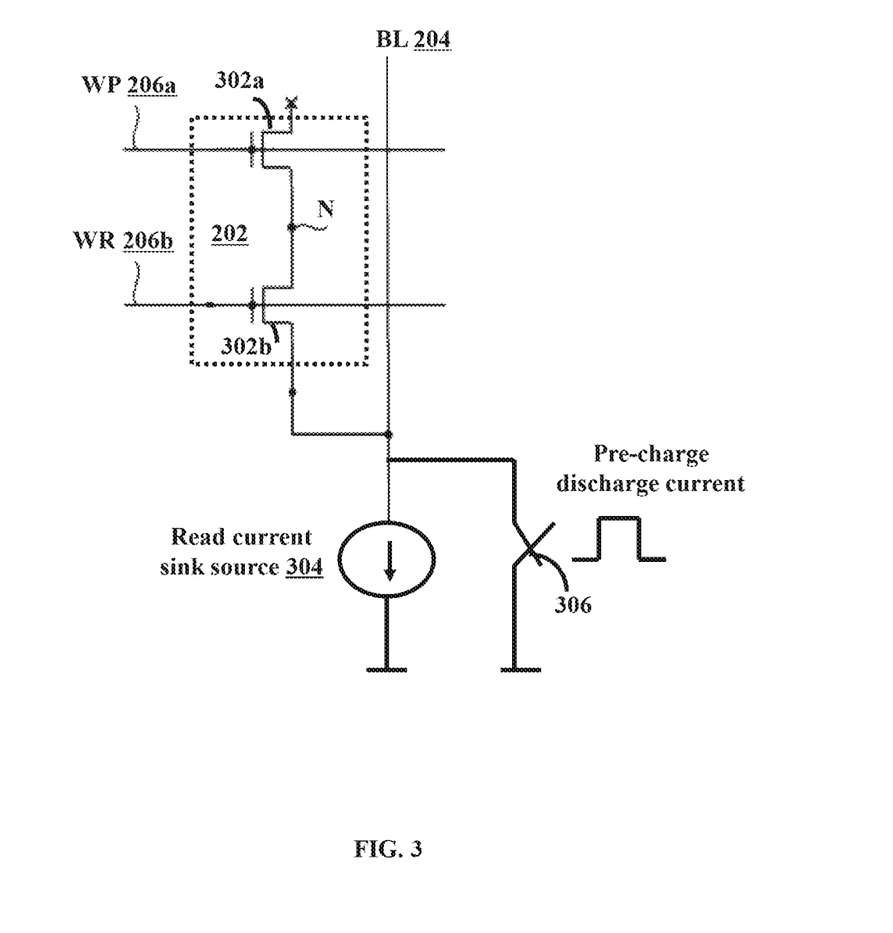
FIG. 3 depicts a circuit diagram of a bitcell of the OTP memory, according to embodiments of the inventive concept as disclosed herein.

A circuit diagram of the OTP memory cell/bitcell 202 is depicted in FIG. 3. As depicted in FIG. 3, the bitcell 202 includes an antifuse AF 302a, and a read transistor TR 302b. The bitcell 202 also includes a switching transistor TS (not shown), which may be used during the write operation of the OTP memory 200.

The antifuse AF 302a may be connected between the corresponding WL 206a and an intermediate node N. The antifuse AF 302a may be implemented with a metal oxide semiconductor (MOS) transistor. A drain electrode of the MOS transistor/antifuse AF 302a may be floated, a source electrode of the MOS transistor may be connected to the intermediate node N, and a gate electrode of the MOS transistor may be connected to the corresponding WP 206a. The antifuse AF 302a may have an electrical feature opposite to a typical fuse, such that the antifuse AF 302a may have a higher resistance value in an unprogrammed state (i.e., during the read operation) and a lower resistance value in a programmed state (i.e., during the write operation).

The read transistor TR 302b may be connected between the intermediate node N and the corresponding WR 206b. A drain electrode of the read transistor TR 302b may be connected to the intermediate node N, a gate electrode of the read transistor TR 302b may be connected to the corresponding WR 206b and a source electrode of the read transistor may be connected to the corresponding BL 204. The BL 204 may be connected to a read current sink source 304. The read current sink source 304 may be a current mirror, which sinks current from the BL 204 during the read operation.

As depicted in FIG. 2, the wordline generation circuit 208 may be coupled to each of the plurality of bitcells 202. The wordline generation circuit 208 may be configured to manage the read operation of the OTP memory 200. The read operation of the OTP memory 200 involves discharging current of the bitline coupled to the bitcell 202 (that has been selected for the read operation) in a pre-conditioning phase and reading the selected bitcell 202 following the pre-conditioning phase in a same clock cycle. During the pre-conditioning phase, the current of the bitline 204 coupled to the selected bitcell 202 may be discharged because all the bitlines may be pre-charged after performing each cycle of a read operation or a write operation of the OTP memory 200. The current of the bitline 204 may be discharged by connecting the bitline 204 to a switch 306 (as depicted in FIG. 3). The current of the bitline 204 discharged during the pre-conditioning phase may be hereinafter referred to as a discharge current.

In an embodiment, the wordline generation circuit 208 dynamically controls wordline voltage of the selected bitcell 202 to discharge the current of the corresponding bitline 204 during the pre-conditioning phase and to read the selected bitcell 202 following the pre-conditioning phase in the same clock cycle. The wordline voltage of the selected bitcell 202 is the gate voltage of the bitcell 202. Controlling the wordline voltage of the selected bitcell 202 refers to controlling the wordline voltage of the associated WP 206a or the WR 206b, whichever is limiting the current of the bitline 204 coupled to the selected bitcell 202. In other embodiments, controlling the wordline voltage of the selected bitcell 202 refers to controlling the wordline voltage of the WP 206a and the WR 206b associated with the selected bitcell 202 when both the WP 206a and the WR 206b are contributing to the current of the bitline 204.

In an embodiment, controlling the wordline voltage of the selected bitcell 202 during the pre-conditioning phase includes reducing the wordline voltage of the corresponding WP 206a and/or the WR 206b, which reduces the discharge current of the bitline 204 coupled to the selected bitcell 202. In an embodiment, controlling the wordline voltage of the selected bitcell 202 during the read operation of the corresponding bitcell 202 following the pre-conditioning phase includes increasing the wordline voltage of the corresponding WP 206a and/or the WR 206b to read voltage, which is performed for the read operation of the selected bitcell 202. Thus, dynamically controlling the wordline voltage of the selected bitcell 202 may avoid or reduce the occurrence of unintended discharge current of the bitline during the pre-conditioning phase.

Figure 4:
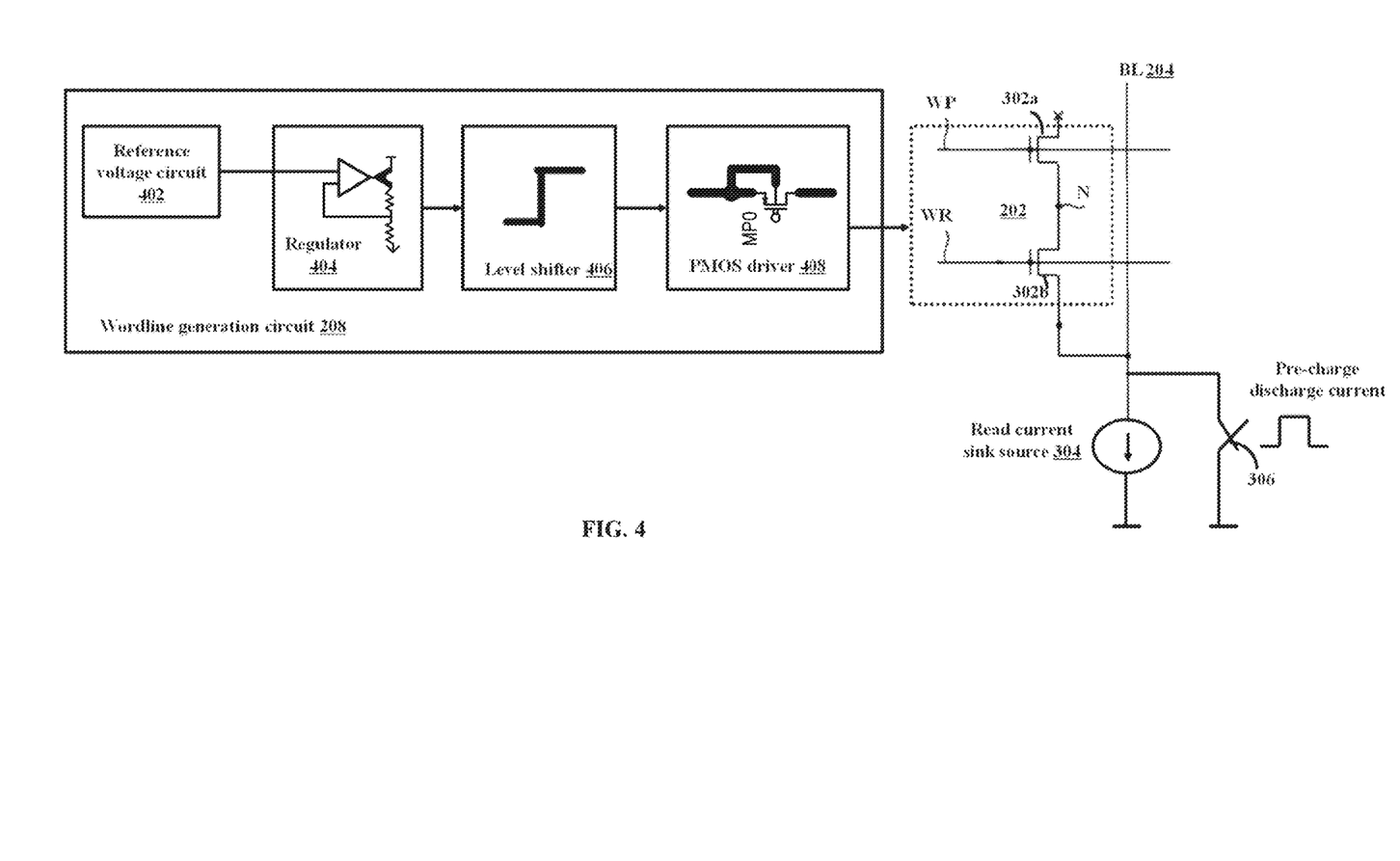
FIG. 4 depicts components of the wordline generation circuit coupled to the bitcell for managing the read operation of the OTP memory, according to embodiments of the inventive concept as disclosed herein.

FIG. 4 depicts components of the wordline generation circuit 208 coupled to the bitcell 202 for managing the read operation of the OTP memory 200, according to embodiments of the inventive concept as disclosed herein.

The wordline generation circuit 208 includes a reference voltage selector/reference voltage circuit 402, a regulator 404, a level shifter 406, and a P-type metal-oxide-semiconductor (PMOS) driver 408 for controlling the wordline voltage of the bitcell 202 (selected for the read operation) through the corresponding bitline 204 during the pre-conditioning phase and the read operation of the bitcell 202 following the pre-conditioning phase.

The reference voltage circuit 402 may be configured to receive a reference voltage for the regulator 404 from suitable power circuitry coupled to the OTP memory 200 and to change the received reference voltage. The reference voltage circuit 402 is configured to change the reference voltage for the regulator 404 based on a settling time of the read operation of the OTP memory 200. The settling time of the read operation may be derived from pre-defined read specifications of the OTP memory 200. The reference voltage circuit 402 changes the reference voltage such that the changed reference voltage does not affect/deteriorate a read margin voltage during the read operation. The reference voltage circuit 402 is configured to apply the changed reference voltage on the regulator 404.

The regulator 404 may be configured to change its regulated output voltage based on the reference voltage applied by the reference voltage circuit 402. In an embodiment, the regulator 404 includes an indirect-compensated folded cascode operational amplifier (op-amp), and a diode coupled with a PMOS gate for a feedback factor to change its regulated output voltage. It is understood that the regulator 404 of any architecture (including above) may be used to change the regulated output voltage by changing the reference voltage, which has been received from the reference voltage circuit 402.

The regulator 404 is configured to provide the changed regulated output voltage to the PMOS driver 408 through the level shifter 206. The level shifter 206 referred herein may be a low to high level shifter. The level shifter 206 may be configured to shift the changed regulated output voltage of the regulator 404 to a high regulated voltage and to provide the high regulated voltage to the PMOS driver 408.

The PMOS driver 408 is a metal-oxide-semiconductor (MOS) switch, which is configured to pass the word line voltage to the bitcell 202. In an embodiment, the PMOS driver 408 controls the wordline voltage of the bitcell 202 selected for the read operation, based on the received high regulated voltage from the level shifter 206. The controlled wordline voltage of the selected bitcell 202 controls the discharge current of the respectively coupled bitline 204 in the pre-conditioning phase that is followed by the read operation of the bitcell 202 in the same clock cycle.

The reference voltage circuit 402, the regulator 404, and the PMOS driver 408 control the respective output voltages for the pre-conditioning phase and the read operation of the selected bitcell 202, inversely.

Embodiments are described herein including a description of example operations of the components of the wordline generation circuit 208 during the pre-conditioning phase, wherein the current of the bitline 204 coupled to the selected bitcell 202 may be discharged.

During the pre-conditioning phase (or at the beginning of the read operation), the reference voltage circuit 402 receives the reference voltage for the regulator 404 from the suitable power circuitry coupled to the OTP memory 200 and reduces the reference voltage for the regulator 404. The reference voltage circuit 402 reduces the reference voltage for the regulator 404 based on the settling time of the read operation of the OTP memory 200. The settling time of the read operation may be derived from the pre-defined read specifications of the OTP memory 200. The reference voltage circuit 402 applies the reduced reference voltage to the regulator 404.

The regulator 404 reduces/lowers its regulated output voltage based on the reduced reference voltage. The regulator 404 provides the reduced regulated output voltage to the level shifter 406. The level shifter 406 shifts the reduced regulated output voltage of the regulator 404 to the corresponding high voltage and provides the shifted high voltage corresponding to the reduced regulated output voltage of the regulator 404 to the PMOS driver 408.

The PMOS driver 408 outputs the wordline voltage in response to receiving the high voltage corresponding to the reduced regulated output voltage of the regulator 404 from the level shifter 406. The PMOS driver 408 outputs the wordline voltage by reducing the wordline voltage to a new wordline voltage that is less than the read voltage. The read voltage is a voltage used for the read operation of the selected bitcell 202 following the pre-conditioning phase.

The PMOS driver 408 applies the reduced wordline voltage/new voltage that is less than the read voltage to the selected bitcell 202, which in turn reduces the discharge current of the corresponding bitline 204 in the pre-conditioning phase. The PMOS driver 408 may apply the reduced wordline voltage to the selected bitcell 202 by applying the reduced wordline voltage to the WP 206a or the WR 206b coupled to the selected bitcell 202, whichever is limiting the current of the corresponding bitline 204. Alternatively, the PMOS driver 408 may apply the reduced wordline voltage to the selected bitcell 202 by applying the reduced wordline voltage to both the WP 206a and the WR 206b coupled to the selected bitcell 202 when both the WP 206a and the WR 206b are contributing to the current of the corresponding bitline 204. Thus, during the pre-conditioning phase, the discharge current of the bitline 204 coupled to the selected bitcell 202 is reduced by reducing the wordline voltage of the corresponding WP 206a and/or WR 206b.

Embodiments are described herein including a description of example operations of the components of the wordline generation circuit 208 during the read operation of the selected bitcell 204, which follows the pre-conditioning phase in the same clock cycle.

During the read operation of the selected bitcell 204 following the pre-conditioning phase in the same clock cycle, the reference voltage circuit 402 increases the reference voltage for the regulator 404. In an embodiment, the reference voltage circuit 402 increases the reference voltage based on the settling time of the read operation of the OTP memory 200. The reference voltage circuit 402 applies the increased reference voltage to the regulator 404.

The regulator 404 increases its regulated output voltage, based on the increased reference voltage. The regulator 404 provides the increased regulated output voltage to the level shifter 406. The level shifter 406 shifts the increased regulated output voltage of the regulator 404 to the corresponding high voltage and provides the shifted high voltage corresponding to the increased regulated output voltage of the regulator 404 to the PMOS driver 408.

The PMOS driver 408 outputs the wordline voltage in response to receiving the high voltage corresponding to the lower regulated output voltage of the regulator 404 from the level shifter 406. The PMOS driver 408 outputs the wordline voltage by increasing the wordline voltage to the read voltage, which is used for the read operation of the selected bitcell 202.

The PMOS driver 408 applies the increased wordline voltage to the selected bitcell 202 for the read operation of the corresponding bitcell 202. The PMOS driver 408 may apply the increased wordline voltage on the selected bitcell 202 by applying the increased wordline voltage to the WP 206a or the WR 206b coupled to the selected bitcell 202, whichever is limiting the current of the corresponding bitline 204. Alternatively, the PMOS driver 408 may apply the increased wordline voltage to the selected bitcell 202 by applying the reduced wordline voltage to both the WP 206a and the WR 206b coupled to the selected bitcell 202 when both the WP 206a and the WR 206b are contributing to the current of the corresponding bitline 204.

Thus, the wordline voltage of the selected bitcell 202 may be reduced during the pre-conditioning phase and increased during the read operation of the corresponding bitcell 202, which reduces unintended discharge current of the bitline during the pre-conditioning phase and reduces overshoot of the wordline voltage of the WP 206a and/or the WR 206b after discharging the bitline in the pre-conditioning phase. Reducing the unintended discharge current of the bitline during the pre-conditioning phase may, in turn, reduce load and current requirements of the regulator 404 during the pre-conditioning phase.

Figure 5:
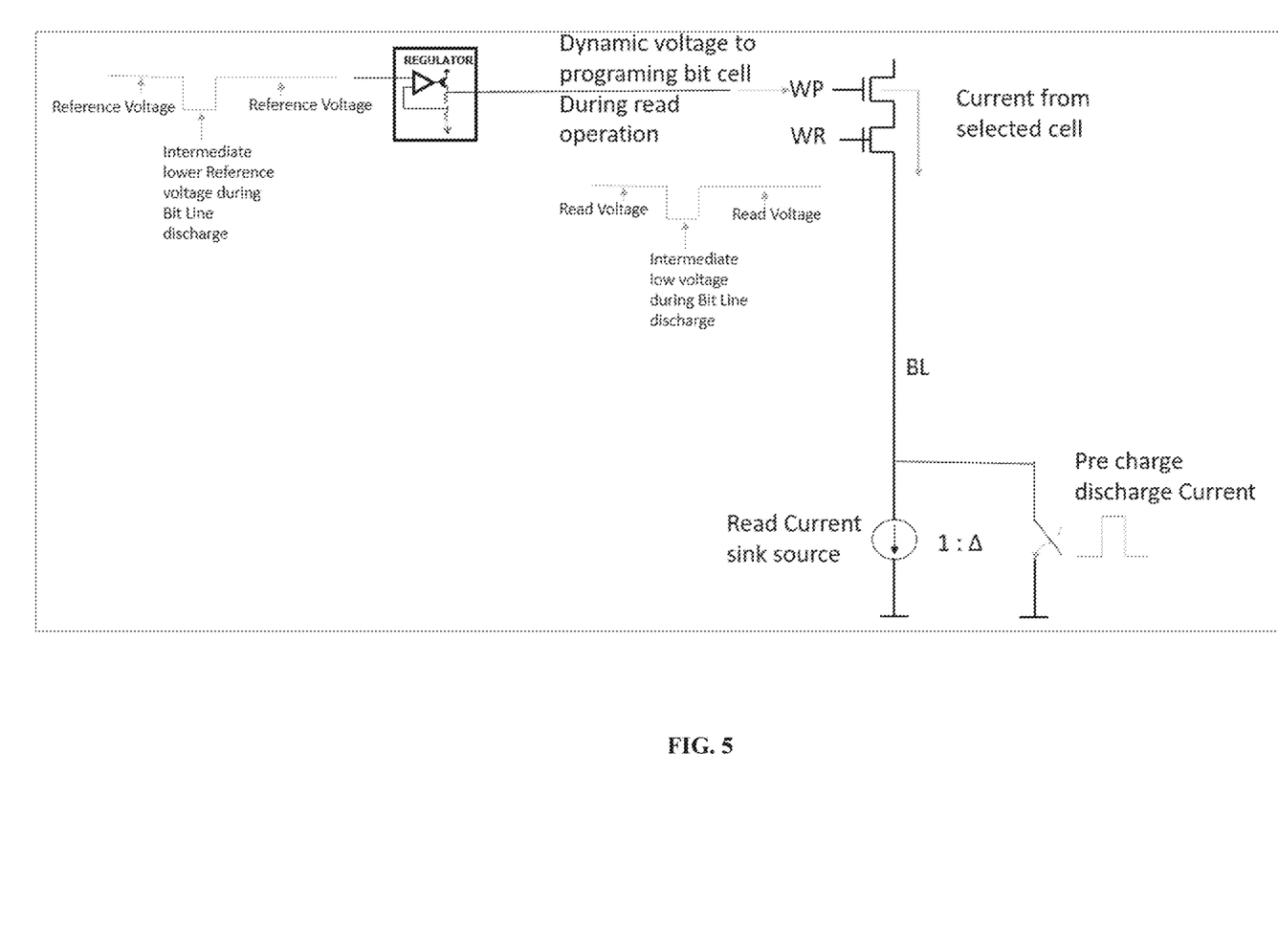
FIG. 5 is an example diagram depicting a process of dynamically controlling wordline voltage of the bitcell through a corresponding bitcell during the read operation of the OTP memory, according to embodiments of the inventive concept as disclosed herein.

FIG. 5 is an example diagram depicting a process of dynamically controlling the wordline voltage of the bitcell 202 through the corresponding bitcell 204 during the read operation of the OTP memory 200, according to embodiments of the inventive concept as disclosed herein. Embodiments described herein may enable the wordline generation circuit 208 to reduce the unintended pre-conditioning discharge current, which may occur at the beginning of the read operation irrespective of read cycle time. The wordline generation circuit 208 includes the reference voltage circuit 402, the regulator 404, the level shifter 406, and the PMOS driver 408.

At the beginning of the read operation of the selected bitcell 202 of the OTP memory 202 (i.e., during the pre-conditioning phase), the reference voltage circuit 402 receives the reference voltage to be applied to the regulator 404 and reduces the reference voltage. The reference voltage circuit 402 reduces the reference voltage based on the settling time of the read operation. The reference voltage circuit 402 applies the reduced reference voltage to the regulator 404. The reduced reference voltage applied to the regulator 404 reduces the regulated output voltage of the regulator 404. The regulator 404 provides the reduced regulated output voltage to the PMOS driver 408 through the level shifter 406. Based on the received reduced regulated output voltage, the PMOS driver 408 lowers the wordline voltage on the WP 206a and/or the WR 206b coupled to the selected bitcell 204, which in turn reduces the discharge current ('Δ') of the bitline 204 coupled to the selected bitcell 202. Reducing the discharge current of the bitline 204 results in less loading on the regulator 404. The less loading on the regulator 404 at the time of discharging the current of the bitline 204 further reduces the overshoot at the regulated wordline voltage of the WP 206a and/or the WR 206b after discharging the current of the bitline 204. In addition, reducing the discharge current of the bitline 204 may save both an area consumed and power for the OTP memory 200.

After discharging the current of the bitline/pre-conditioning phase, the reference voltage circuit 402 increases the reference voltage and applies the increased reference voltage to the regulator 404. The regulator 404 increases its regulated output voltage, based on the increased reference voltage, and provides the increased regulated output voltage to the PMOS driver 408 through the level shifter 406. The PMOS driver 408 increases the wordline voltage to the read voltage on the WP 206a and/or the WR 206b coupled to the selected bitcell 204 for the read operation of the selected bitcell 202 following the pre-conditioning phase.

Figure 6:
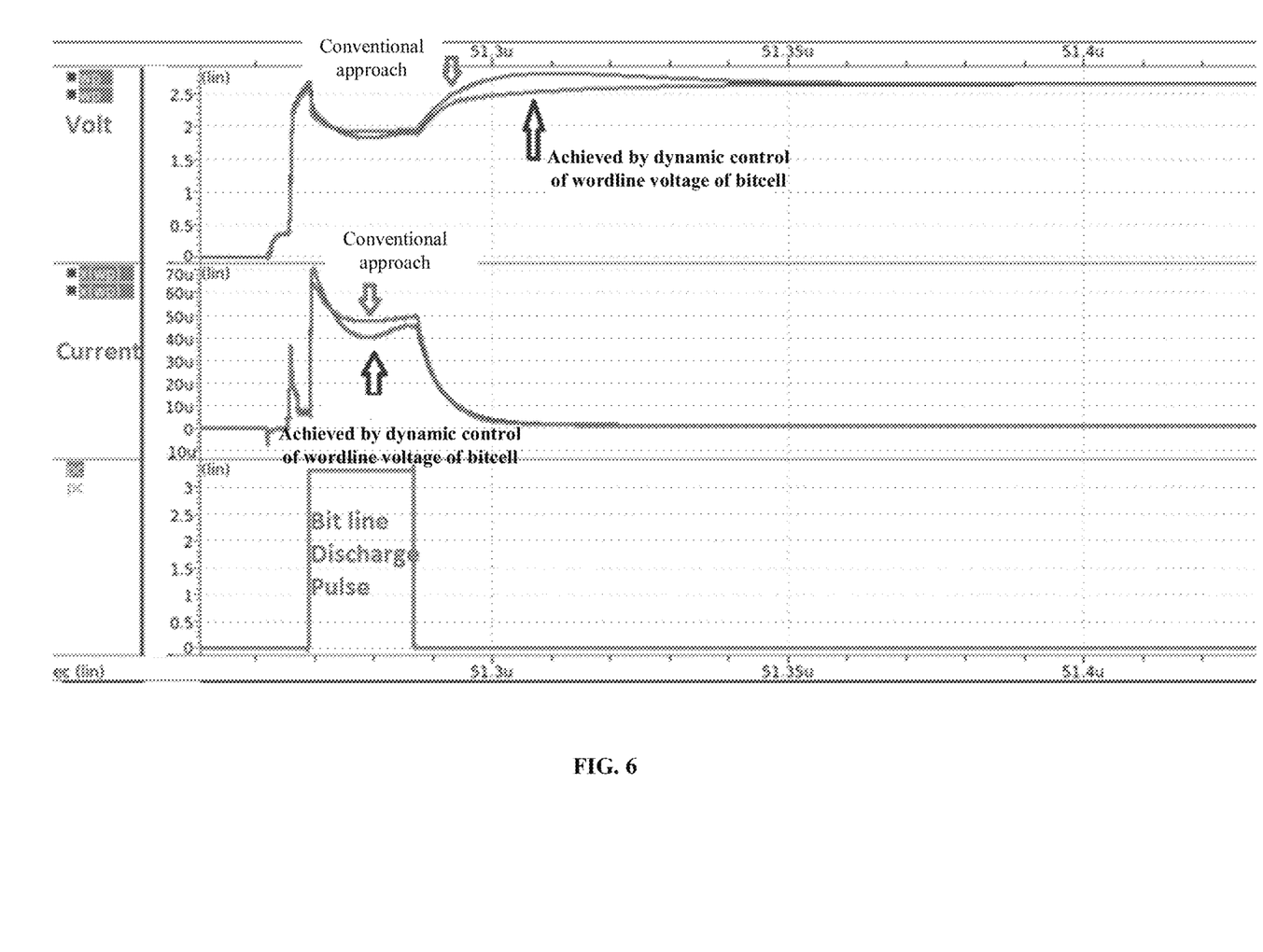
FIG. 6 depicts an example waveform in which the discharge current of the bitline coupled to the selected bitcell is reduced according to embodiments of the inventive concept as disclosed herein and compared to conventional approaches.

FIG. 6 depicts an example waveform in which the discharge current of the bitline 204 coupled to the selected bitcell 202 is reduced, compared to conventional approaches, according to embodiments of the inventive concept as disclosed herein.

In the conventional approaches, a constant wordline voltage may be applied on the WP 206a and/or the WR 206b associated with the selected bitcell during the read operation of the OTP memory, which increases the discharge current of the bitline coupled to the bitcell at the beginning of the read operation, as depicted in an example waveform of FIG. 6.

In contrast, embodiments of the inventive concept described herein dynamically control the wordline voltage of the WP 206a and/or the WR 206b associated with the selected bitcell 202 during the pre-conditioning phase (at the beginning of the read operation) and the read operation of the corresponding bitcell 202. Dynamically controlling the wordline voltage of the WP 206a and/or the WR 206b associated with the selected bitcell 202 during the pre-conditioning phase reduces the discharge current of the bitline 204 coupled to the selected bitcell 202 as depicted in an example waveform of FIG. 6. Such dynamic voltage control may result in improvement in the wordline voltage and the current of the WP 206a and/or the WR 206b during the pre-conditioning phase. Reducing the discharge current of the bitline 204 further reduces the overshoot at the regulated wordline voltage of the WP 206a and/or the WR 206b after discharging the current of the bitline as depicted in an example waveform FIG. 6.

Figure 7:
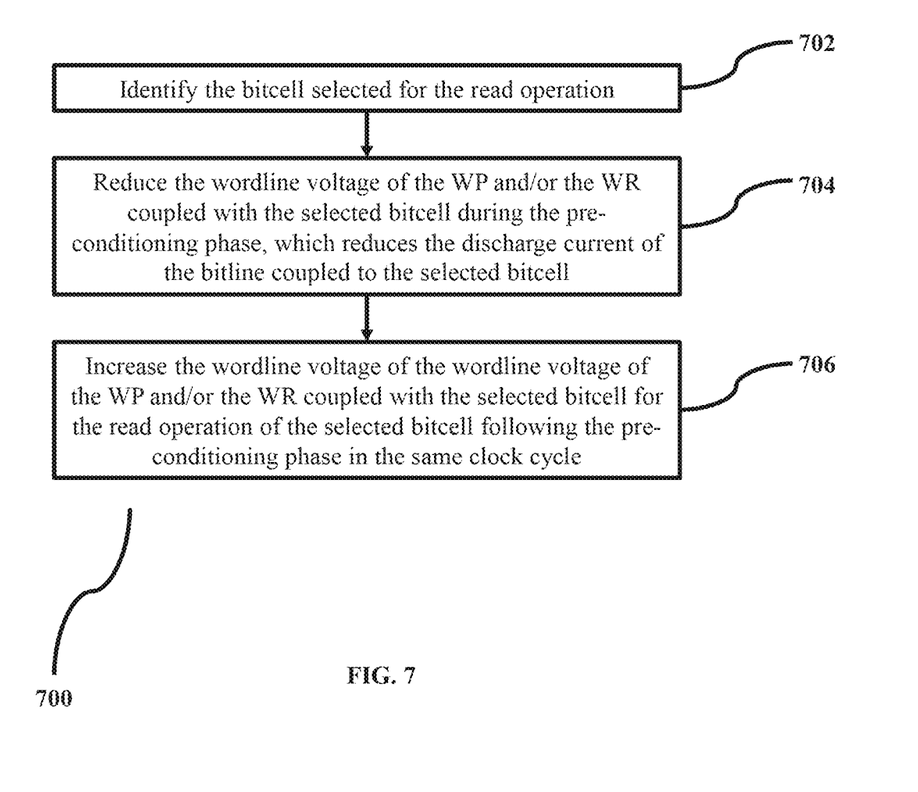
FIG. 7 is a flowchart depicting a method for managing the read operation of the OTP memory, according to embodiments of the inventive concept as disclosed herein.

FIG. 7 is a flowchart 700 depicting a method for managing the read operation of the OTP memory 200, according to embodiments of the inventive concept as disclosed herein.

At block 702, the method includes identifying, by the wordline generation circuit 208, the bitcell 202 selected for the read operation.

At block 704, the method includes reducing, by the wordline generation circuit 208, the wordline voltage of the WP 206a and/or the WR 206b coupled with the selected bitcell 202 during the pre-conditioning phase (at the beginning of the read operation), which reduces the discharge current of the bitline 204 coupled to the selected bitcell 202. The wordline voltage of the WP 206a and/or the WR 206b may be reduced based on the setting time of the read operation and the read voltage required for the read operation of the selected bitcell 202.

At block 706, the method includes increasing, by the wordline generation circuit 208, the wordline voltage of the wordline voltage of the WP 206a and/or the WR 206b coupled with the selected bitcell 202 for the read operation of the selected bitcell 202 following the pre-conditioning phase in the same clock cycle. The various actions or operations in method 700 may be performed in the order presented, in a different order, and/or simultaneously. Further, in some embodiments, some actions or operations listed in FIG. 7 may be omitted.

Figure 8:
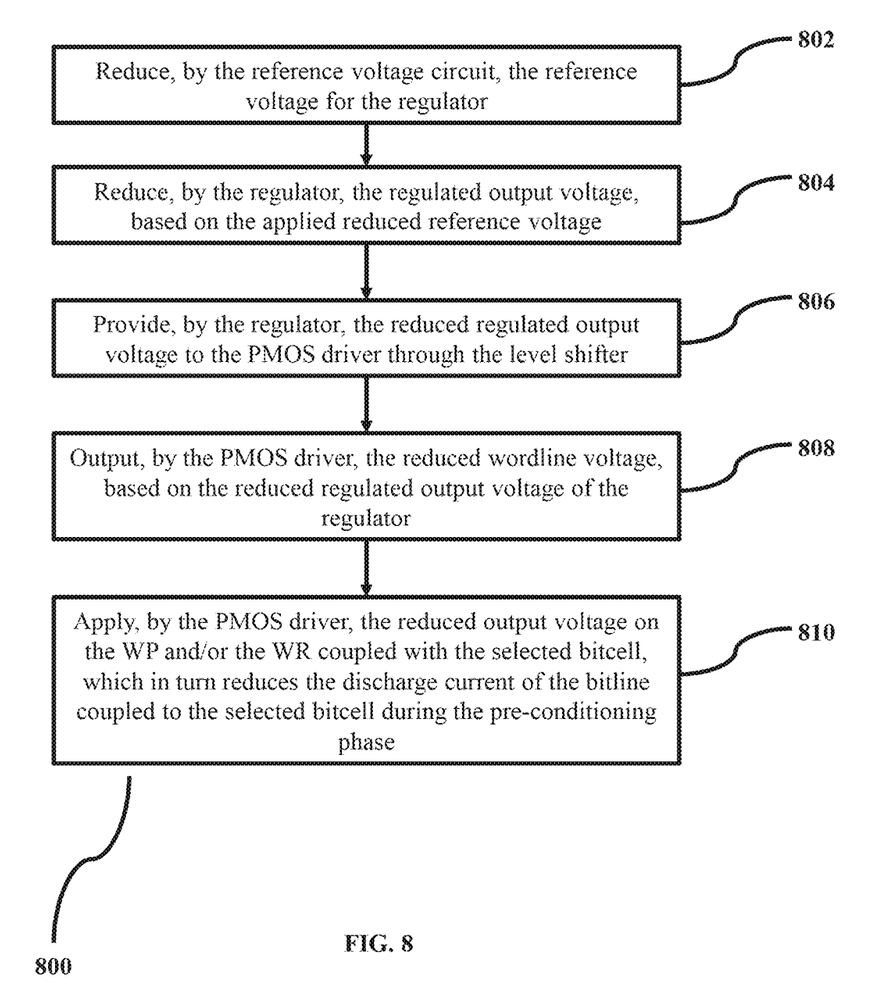
FIG. 8 is a flowchart depicting a method for reducing the discharge current of the bitline coupled to the bitcell selected for the read operation, during a pre-conditioning phase, according to embodiments of the inventive concept as disclosed herein.

FIG. 8 is a flowchart 800 depicting a method for reducing the discharge current of the bitline 204 coupled to the bitcell 204 selected for the read operation, during the pre-conditioning phase, according to embodiments of the inventive concept as disclosed herein. Embodiments described herein may enable the wordline generation circuit 208 to reduce the discharge current of the bitline 204 coupled to the bitcell 202 selected for the read operation, during the pre-conditioning phase, by decreasing the wordline voltage of the WP 206a and/or the WR 206b coupled with the selected bitcell 202. The wordline generation circuit 208 includes the reference voltage circuit 402, the regulator 404, the level shifter 406, and the PMOS driver 408 for decreasing the wordline voltage of the WP 206a and/or the WR 206b coupled with the selected bitcell 202.

At block 802, the method includes reducing, by the reference voltage circuit 402, the reference voltage for the regulator 404. The reference voltage circuit 402 reduces the reference voltage based on the settling time of the read operation of the OTP memory 200, which have been derived from the pre-defined specifications of the OTP memory 200.

At block 804, the method includes reducing, by the regulator 404, the regulated output voltage, based on the applied reduced reference voltage.

At block 806, the method includes providing, by the regulator 404, the reduced regulated output voltage to the PMOS driver 408 through the level shifter 406.

At block 808, the method includes, outputting, by the PMOS driver 408, the reduced wordline voltage, based on the reduced regulated output voltage of the regulator 404. The reduced wordline voltage that is output may be less than the read voltage required for the read operation of the selected bitcell 202.

At block 810, the method includes, applying, by the PMOS driver 408, the reduced output voltage to the WP 206a and/or the WR 206b coupled to the selected bitcell 202, which in turn reduces the discharge current of the bitline 204 coupled to the selected bitcell 202 during the pre-conditioning phase. The various actions or operations in method 800 may be performed in the order presented, in a different order, and/or simultaneously. Further, in some embodiments, some actions or operations listed in FIG. 8 may be omitted.

Figure 9:
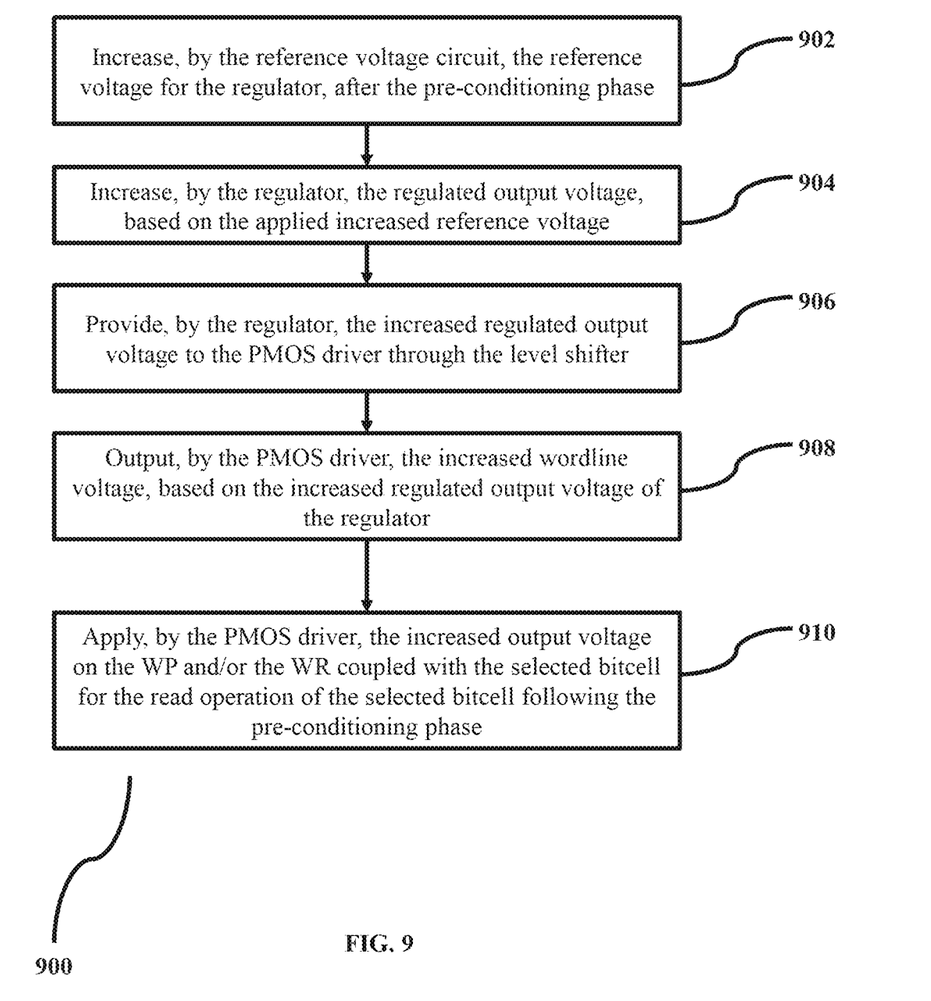
FIG. 9 is a flowchart depicting a method for increasing the wordline voltage of the bitcell for the read operation following the pre-conditioning phase, according to embodiments of the inventive concept as disclosed herein.

FIG. 9 is a flowchart 900 depicting a method for increasing the wordline voltage of the bitcell 202 for the read operation following the pre-conditioning phase, according to embodiments of the inventive concept as disclosed herein.

At block 902, the method includes increasing, by the reference voltage circuit 402, the reference voltage for the regulator 404, after the pre-conditioning phase. The reference voltage circuit 402 increases the reference voltage based on the settling time of the read operation of the OTP memory 200, which have been derived from the pre-defined specifications of the OTP memory 200.

At block 904, the method includes increasing, by the regulator 404, the regulated output voltage, based on the applied increased reference voltage.

At block 906, the method includes providing, by the regulator 404, the increased regulated output voltage to the PMOS driver 408 through the level shifter 406.

At block 908, the method includes, outputting, by the PMOS driver 408, the increased wordline voltage, based on the increased regulated output voltage of the regulator 404. The increased wordline voltage that is output may be the read voltage used for the read operation of the selected bitcell 202.

At block 910, the method includes, applying, by the PMOS driver 408, the increased output voltage to the WP 206a and/or the WR 206b coupled to the selected bitcell 202 for the read operation of the selected bitcell 202 following the pre-conditioning phase. The various actions in method 900 may be performed in the order presented, in a different order, and/or simultaneously. Further, in some embodiments, some actions or operations listed in FIG. 9 may be omitted.

Figure 10:
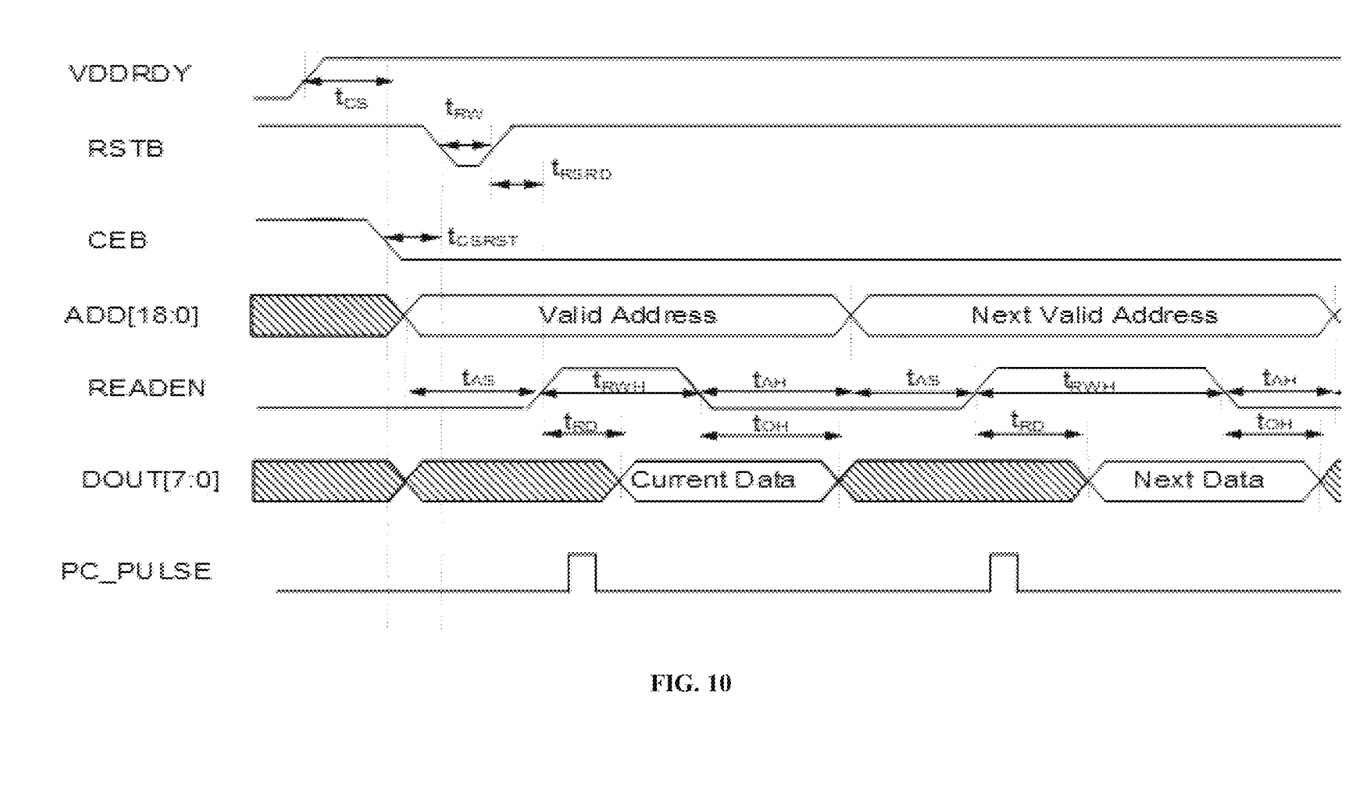
FIG. 10 depicts a timing diagram of the read operation of the OTP memory, according to embodiments of the inventive concept as disclosed herein.

FIG. 10 depicts a timing diagram of the read operation of the OTP memory 200, according to embodiments of the inventive concept as disclosed herein.

Embodiments described herein may reduce unintended preconditioning discharge current during a read operation of a one time programmable (OTP) memory by dynamically changing wordline voltage of a selected bitcell through an associated bitline.

Embodiments described herein may control the wordline voltage of at least one selected bitcell of the OTP memory to discharge current of at least one bitline coupled to the at least one selected bitcell during a pre-conditioning phase and read the at least one selected bitcell following the pre-conditioning phase in a same clock cycle.

Embodiments described herein may use a reference voltage circuit, a regulator, a level shifter, and a PMOS driver to dynamically control the wordline voltage of the selected bitcell through the associated bitline during the pre-conditioning phase and the read operation of the OTP memory. Such operations may result in the following improvements:

area: Embodiments described herein may reduce a regulator capacity requirement. In an example, a size of the regulator may be reduced by 50%, compared to conventional approaches. Reduced size of the regulator reduces the area consumed by the OTP memory.

performance: Embodiments described herein may improve a settling time of a regulated output voltage of the regulator from 90% to 50% (for example), with less power.

power: Embodiments described herein may reduce the discharge current of the bitline during the pre-conditioning phase, which in turn may reduce the current capability requirement of the regulator and hence the constraint of load and line regulation for regulator. As a result, the performance of the OTP memory may be enhanced through lesser power consumption.

The embodiments described herein can be implemented through at least one software program running on at least one hardware device and performing network management functions to control the elements. The elements shown in FIGS. 2, 3, and 4 can be at least one of a hardware device, or a combination of hardware device and software module.

The embodiments described herein illustrate methods and systems for managing a read operation of a one time programmable (OTP) memory. Therefore, it is understood that the scope of the protection is extended to such a program and in addition to a computer readable memory having computer readable program code stored therein, such computer readable memory or storage means containing computer readable program code or program code means for implementation of one or more operations of the method, when the program runs on a processor, server, mobile device, and/or any suitable programmable device. The method is implemented in an example embodiment through or together with a software program written in e.g., Very high speed integrated circuit Hardware Description Language (VHDL) or another programming language, or implemented by one or more VHDL or several software modules being executed on at least one hardware device. The hardware device may be any kind of portable device that may be programmed. The device may also include means which could be e.g., hardware means, e.g., an ASIC, or a combination of hardware and software means, e.g., an ASIC and an FPGA, or at least one microprocessor and at least one memory with software modules located therein. The method embodiments described herein may be implemented partly in hardware and partly in software. Embodiments of the invention may also be implemented on different hardware devices, e.g., using a plurality of CPUs.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein can be practiced with modification within the spirit and scope of the embodiments as described herein.

What is claimed is:

1. A One Time Programmable (OTP) memory comprising:
a plurality of bitcells;
a plurality of bitlines, each bitline coupled to the plurality of bitcells; and
a wordline generation circuit coupled to each of the plurality of bitcells, the word line generation circuit comprising a reference voltage circuit, a regulator, a level shifter, and a P-type metal-oxide-semiconductor (PMOS) driver coupled in series,
wherein the wordline generation circuit is configured to:
control a wordline voltage of at least one selected bitcell of the plurality of bitcells to discharge current of at least one bitline coupled to the at least one selected bitcell during a pre-conditioning phase and to perform a read operation of the at least one selected bitcell following the pre-conditioning phase in a same cycle of a bit line discharge pulse signal, and wherein the reference voltage circuit is configured to:

change a reference voltage for the regulator during the pre-conditioning phase and the read operation following the pre-conditioning phase in the same cycle of the bit line discharge pulse signal; and apply the changed reference voltage on the regulator, wherein the regulator is configured to:

change a regulated output voltage based on the applied change reference voltage during the pre-conditioning phase and the read operation following the pre-conditioning phase in the same cycle of the bit line discharge pulse signal; and provide the changed regulated output voltage to the PMOS driver through the level shifter;

wherein the PMOS driver is configured to:

control the wordline voltage of the at least one selected bitcell based on the received changed regulated output voltage from the regulator during the pre-conditioning phase and the read operation following the pre-conditioning phase in the same cycle of the bit line discharge pulse signal, wherein the controlled wordline voltage of the at least one selected bitcell controls the discharge current of the respectively coupled at least one bitline during the pre-conditioning phase that is followed by the read operation of the same cycle of the bit line discharge pulse signal.

2. The OTP memory of claim 1, wherein the wordline generation circuit is further configured to discharge the at least one bitline by connecting the at least one bitline to a ground voltage through a switch.

3. The OTP memory of claim 1, wherein
the wordline voltage of the at least one selected bitcell is a gate voltage of the at least one selected bitcell; and
each of the plurality of bitcells is coupled to one of a plurality of wordlines, wherein each of the plurality of wordlines includes a wordline for a program gate (WP) and a wordline for a read gate (WR).

4. The OTP memory of claim 1, wherein the reference voltage circuit is configured to change the reference voltage for the regulator by:
reducing the reference voltage for the regulator, during the pre-conditioning phase based on a settling time of the read operation that is derived from pre-defined read specifications of the OTP memory; and increasing the reference voltage for the regulator, during the read operation of the at least one selected bitcell following the pre-conditioning phase in the same cycle of the bit line discharge pulse signal.

5. The OTP memory of claim 4, wherein the reference voltage circuit is further configured to change the regulated output voltage by:
reducing the regulated output voltage based on the reduced reference voltage for the regulator during the pre-conditioning phase; and
increasing the regulated output voltage based on the increased reference voltage for the regulator during the read operation of the at least one selected bitcell following the pre-conditioning phase in the same cycle of the bit line discharge pulse signal.

6. The OTP memory of claim 5, wherein the regulator includes an indirect-compensated folded cascode operational amplifier (op-amp), and a diode coupled with a PMOS gate for a feedback factor to change the regulated output voltage.

7. The OTP memory of claim 1, wherein the PMOS driver is configured to control the wordline voltage of the at least one selected bitcell by:
reducing the wordline voltage of the at least one selected bitcell to a new wordline voltage that is less than read voltage used for the read operation during the pre-conditioning phase; and
increasing the wordline voltage of the at least one selected bitcell to the read voltage used for the read operation, during the read operation of the at least one selected bitcell following the pre-conditioning phase in the same cycle of the bit line discharge pulse signal.

8. The OTP memory of claim 7, wherein the PMOS driver is configured to reduce and increase the wordline voltage of the at least one selected bitcell by:
reducing and increasing wordline voltage of the corresponding WP or wordline voltage of the corresponding WR whichever is limiting current in the bitline; or
reducing and increasing the wordline voltage of the corresponding WP and the wordline voltage of the corresponding WR when both the WP and the WR are contributing to the current in the bitline.

9. The OTP memory of claim 1, wherein the discharge current of the at least one bitline is reduced during the pre-conditioning phase.

* * * * *